US009389654B2

(12) United States Patent
McKenney et al.

(10) Patent No.: US 9,389,654 B2
(45) Date of Patent: Jul. 12, 2016

(54) AIR-FLOW-BY COOLING TECHNOLOGY AND AIR-FLOW-BY CIRCUIT BOARD MODULES

(71) Applicant: MERCURY COMPUTER SYSTEMS, INC., Chelmsford, MA (US)

(72) Inventors: Darryl J. McKenney, Londonderry, NH (US); Paul Zuidema, Cohasset, MA (US); Donald Blanchet, Burlington, MA (US); Daniel Coolidge, Tyngsborough, MA (US)

(73) Assignee: MERCURY SYSTEMS, INC., Chelmsford, MA (US)

( * ) Notice: Subject to any disclaimer, the term of this patent is extended or adjusted under 35 U.S.C. 154(b) by 144 days.

(21) Appl. No.: 14/095,691

(22) Filed: Dec. 3, 2013

(65) Prior Publication Data

US 2014/0160670 A1    Jun. 12, 2014

Related U.S. Application Data

(60) Provisional application No. 61/732,794, filed on Dec. 3, 2012.

(51) Int. Cl.
*G06F 1/20* (2006.01)
*H05K 7/20* (2006.01)
*H05K 7/14* (2006.01)

(52) U.S. Cl.
CPC ............... *G06F 1/20* (2013.01); *H05K 7/1452* (2013.01); *H05K 7/20563* (2013.01); *H05K 7/20572* (2013.01)

(58) Field of Classification Search
CPC ............................. H05K 7/20563; G06F 1/20
See application file for complete search history.

(56) References Cited

U.S. PATENT DOCUMENTS 4,692,840 A * 9/1987 Ellis ............................. 361/729
4,771,365 A    9/1988 Cichocki et al.
6,661,657 B1   12/2003 Banton et al.
(Continued)

FOREIGN PATENT DOCUMENTS

EP      1938677 A2    7/2008
WO   2007/047386 A2   4/2007

OTHER PUBLICATIONS

International Preliminary Report on Patentability for Application No. PCT/US2013/072869, 18 pages, dated Jun. 11, 2015.
(Continued)

*Primary Examiner* — Tuan T Dinh
*Assistant Examiner* — Mukund G Patel
(74) *Attorney, Agent, or Firm* — Nelson Mullins Riley & Scarborough LLP

(57) ABSTRACT

Various embodiments provide a circuit board module include a primary cover, a secondary cover and a circuit board sandwiched between the primary cover and the secondary cover. A first set of fins or channels may be provided on a surface of the primary cover. The first set of fins or channels guide cooling air flowing on the surface of the primary cover. A second set of fins or channels may be provided on a surface of the second cover. The second set of fins or channels guide the cooling air flowing on the surface of the secondary cover. The second set of fins or channels intermates with the first set of fins or channels to form a sealed casing enclosing the circuit board. The sealed casing forms a Faraday cage to protect the circuit board from electromagnetic interference.

4 Claims, 14 Drawing Sheets

(56) References Cited

U.S. PATENT DOCUMENTS

| | | |
|---|---|---|
| 6,683,787 B1 | 1/2004 | Banton et al. |
| 6,690,575 B1 | 2/2004 | Banton et al. |
| 6,697,255 B1 | 2/2004 | Banton et al. |
| 6,759,588 B1 | 7/2004 | Banton et al. |
| 6,781,831 B1 | 8/2004 | Banton et al. |
| 6,879,486 B1 | 4/2005 | Banton et al. |
| 8,009,435 B2 * | 8/2011 | Metzger ............... H05K 7/1429 361/704 |
| 2002/0061102 A1 | 5/2002 | Miyazaki et al. |
| 2008/0273316 A1 * | 11/2008 | Sarno et al. .................. 361/807 |

OTHER PUBLICATIONS

Second Written Opinion for Application No. PCT/US2013/072869, 5 pages, dated Mar. 2, 2015.

International Search Report and Written Opinion for Application No. PCT/US2013/072869, 16 pages, dated Sep. 16, 2014.

* cited by examiner

AIR-FLOW-BY COOLING TECHNOLOGY AND AIR-FLOW-BY CIRCUIT BOARD MODULES

RELATED APPLICATIONS

The present application claims priority to a United States provisional application, Patent Application No. 61/732,794, filed Dec. 3, 2012, the contents of which are incorporated herein by reference.

FIELD OF THE INVENTION

The present invention pertains to digital data processing modules and a method for cooling the digital data processing modules, the radio frequency processing modules, and/or the microwave processing modules and, more specifically, to methods and systems for forming circuit board assemblies that can be cooled using the air-flow-by cooling technology.

BACKGROUND

High performance processing modules require adequate cooling in order to perform to their maximum ability. Existing cooling technologies for cooling circuit board modules include air cooling, conduction cooling, liquid cooling and cooling by air-flow-through. While these technologies are used to cool the modules, they are not designed for harsh environments such as dusty or sandy environments. Specifically, the conventional air cooling methods require the cooling air to be filtered before use.

For circuit board modules used in harsh environments, it may not always be possible to filter air prior usage. Accordingly, alternative cooling techniques that provide higher cooling power rates and lower temperature impacts on the components must be developed for circuit board modules used in harsh environments.

SUMMARY

According to various embodiments, a circuit board module is provided. The circuit board module includes a primary cover, a secondary cover and a circuit board sandwiched between the primary cover and the secondary cover. The primary cover includes a plurality of fins or channels for guiding cooling air flowing on a surface of the primary cover. The circuit board module includes a gasket seal provided along a perimeter of the primary cover. The primary cover and the secondary cover couple to form a sealed casing enclosing the circuit board.

In some embodiments, a system comprising a plurality of circuit board modules is provided. Each circuit board module includes a primary cover, a secondary cover and a circuit board sandwiched between the primary cover and the secondary cover. The primary cover includes a plurality of fins or channels for guiding cooling air flowing on surface of the primary cover. Each circuit board module further includes a gasket seal provided along a perimeter of the primary cover. The primary cover and the secondary cover couple to form a sealed casing enclosing the circuit board. The system further includes a backplane and a backplane cover plate coupled to the backplane. The plurality of circuit board modules are coupled to the backplane. The backplane cover plate is provided between the backplane and the plurality of modules coupled to the backplane.

Various embodiments provide a circuit board casing comprising a primary cover and a secondary cover. A first set of fins or channels is provided on a surface of the primary cover. The first set of fins or channels guide cooling air flowing on the surface of the primary cover. A second set of fins or channels is provided on a surface of the second cover. The second set of fins or channels guide the cooling air flowing on the surface of the secondary cover. The secondary cover intermates with the primary cover to form a sealed casing.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

The present invention provides an exemplary circuit board module that includes cover plates forming a casing. The modules are cooled using a fluid, such as air, with the "flow-by" cooling technology where fluid flows directly over the cover plates. Air-flow-by cooling technology is a filterless cooling technology that does not require the cooling air to be filtered prior usage. According to various embodiments, the air-flowby modules ("AFB modules") may have a thickness equal to or less than 1.2 inch, and more specifically in the range of 0.8 inches to 1.2 inches. AFB modules may weigh less than 3.5 lbs. AFB modules in 1.0 inch range of the present invention may be compatible with the conventional circuit board module chassis such as the VITA 48.1 standard chassis. VITA is an incorporated, non-profit organization of vendors and users of modular embedded computing systems. The VITA Standards Organization (VSO), the standards development arm of VITA, is accredited as an American National Standards Institute (ANSI) developer. VITA provides computer bus, board, and system specifications that are known in the art.

The module cover plates described below in connection with various embodiments include a primary cover (i.e., a front cover), and a secondary cover (i.e., a back cover). The primary cover and the secondary cover couple to each other to form a sealed casing. The sealed casing may enclose a circuit board that includes one or more electronic components formed on a substrate. The sealed casing may form a Faraday cage that blocks external static and non-static electric fields by channeling electricity through the casing, providing constant voltage on all sides of the sealed casing. Since the difference in voltage is the measure of electrical potential, no current flows through the sealed casing. For example, the Faraday cage property of the sealed casing may protect the circuit board provided therein from electrostatic discharges.

The primary cover has a plurality of fins or channels that guide the cooling air over the exterior surface of the primary cover facing away from the circuit board enclosed in the sealed casing. According to various embodiments, the secondary cover may also include fins or channels to guide the cooling air over the exterior surface of the secondary cover for improved cooling performance. Various embodiments of the present invention provide a rugged module with a small form factor which is air cooled. Air cooling the rugged module does not require air filters. The cooling is sufficient to cool multiple modules that are closely spaced.

Figure 1:
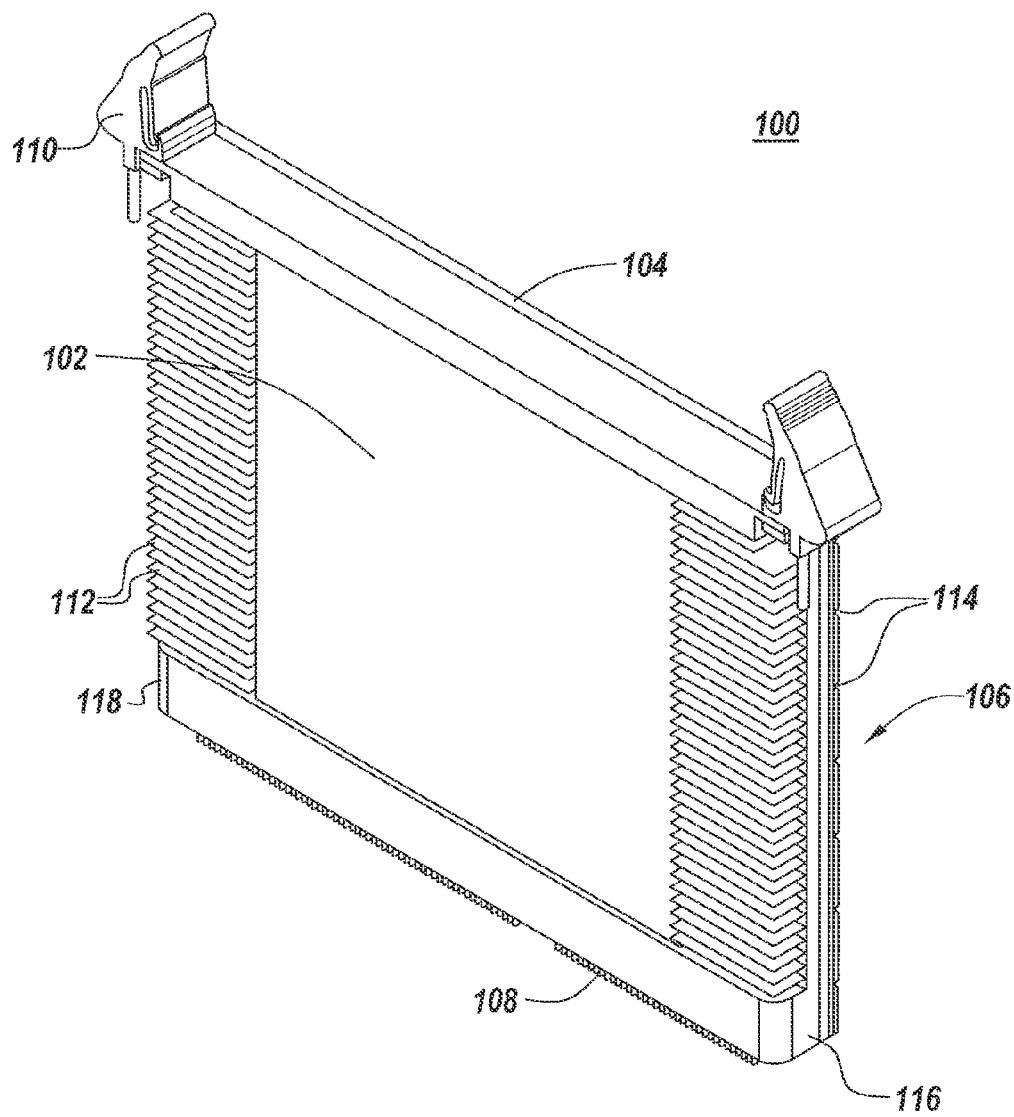
FIG. 1 illustrates an exemplary circuit board module according to various embodiments of the present invention.

An exemplary circuit board module is illustrated in FIG. 1. Module 100 includes a primary cover 102 and a secondary cover 104 that intermate to form a sealed casing 106. According to various embodiments of the present invention, the primary cover 102 and the secondary cover 104 may be plated and/or coated with materials to have a rugged module that stands abrasion caused by a harsh external environment, such as dusty or sandy atmosphere. For example, the primary cover 102 and/or the secondary cover 104 may be nickel-plated or Teflon-coated.

A circuit board may be provided within the casing 106. The circuit board may include a plurality of connectors 108 protruding from the casing 106. The connectors 108 enable the module 100 to be mounted on a motherboard or a backplane forming a computing system.

The module 100 may include one or more ejectors 110. The ejectors 110 allow for effortless removal of the module 100 from the backplane or the motherboard where the module 100 may have been previously mounted. Using the ejectors 110, modules 100 can be easily removed and replaced on the backplane. Ejectors may comply with Vita 48.1 or Vita 48.7 standards.

In some embodiments, the modules 100 should be removed from the backplane without introducing contaminants into connectors of the backplane. According to various embodiments, compressed air may be used to blow contaminants off of the modules prior to removing the modules from the backplane.

As illustrated in FIG. 1, a plurality of fins or channels 112 are formed on the exterior surface of the primary cover 102 facing away from the circuit board provided in the sealed casing. The fins or channels 112 may extend along a portion of the exterior surface of the primary cover 102. Alternatively, the fins or channels 112 may extend along an entire exterior surface of the primary cover 102, as further discussed below in connection with FIG. 2. The fins or channels 112 may extend down along the sides 116, 118 of the primary cover 102 to better control the flow of the air on the surface of the primary cover.

According to various embodiments, a plurality of fins or channels 114 may also be provided on the exterior surface of the secondary cover 104. The fins or channels 112 and 114 guide the cooling air on the front and back surfaces of the module 100, respectively, for cooling the module 100 using the air-flow-by technique. According to various embodiments, the amount of cooling air provided to each module can be measured and controlled by the relationship of the front cover fins 112 to back cover fin 114 geometry.

Figure 2:
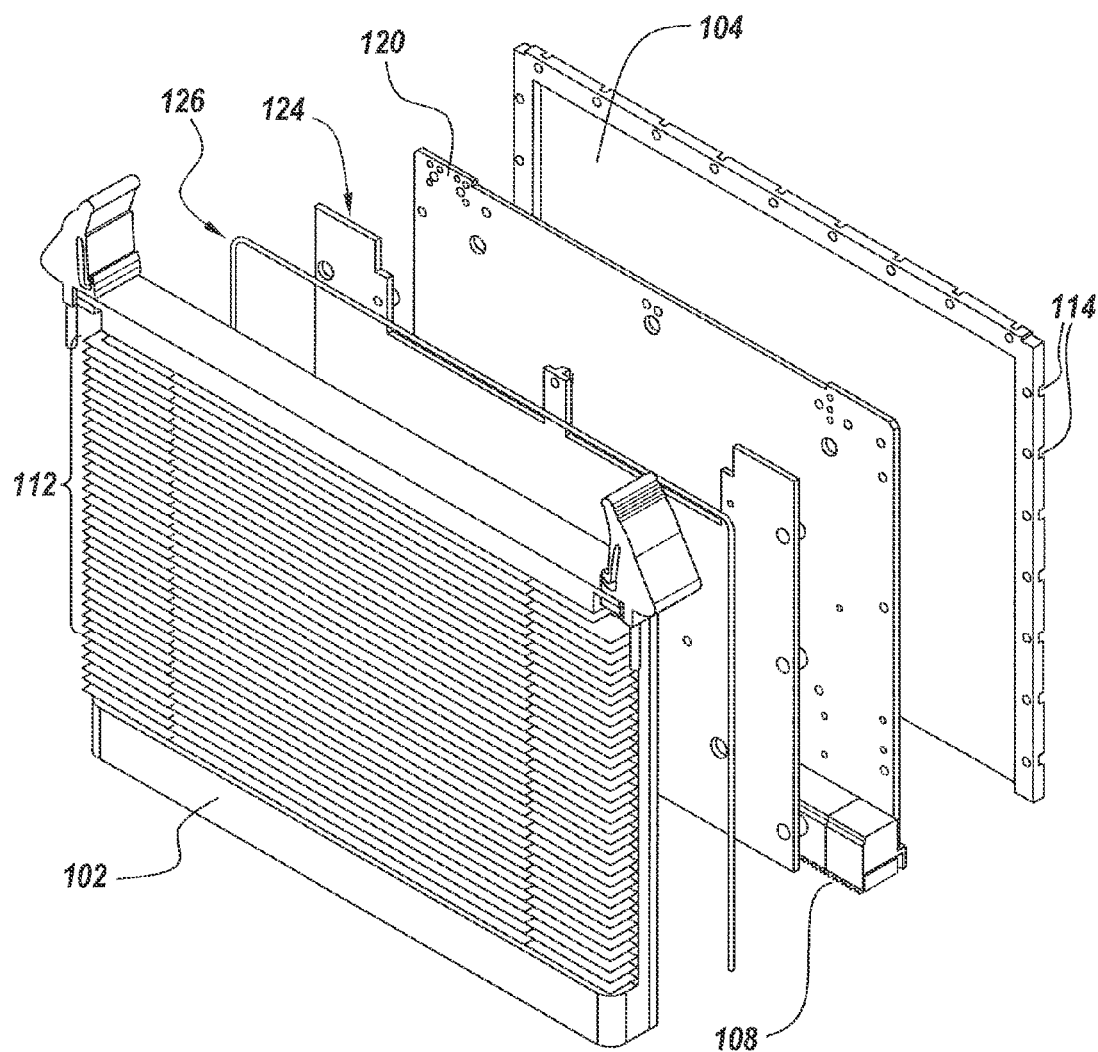
FIG. 2 illustrates an expanded view of components of the exemplary module shown in FIG. 1.

FIG. 2 illustrates an expanded view of components of module 100. In the embodiment illustrated in FIG. 2, fins 112 extend along the entire exterior surface of the primary cover 102. The exterior surface of the secondary cover 104 is also provided with a plurality of fins 114. In the embodiment illustrated in FIG. 2, a circuit board 120 is sandwiched between the primary cover 102 and the secondary cover 104. The circuit board 120 may be a printed circuit board that includes one or more electronic devices. The circuit board 120 may include a plurality of connectors 108 for coupling the circuit board 120 to a backplane or a motherboard. When the module 100 is assembled, the connectors 108 protrude from the sealed casing formed by the primary cover 102 and the secondary cover 104. The protruding connectors 108 may mate with connectors of the backplane or the motherboard.

According to various embodiments, a heat spreader plate 124 may be provided between the primary cover 102 and the circuit board 120. The heat spreader plate 124 may be a high thermal conductivity plate for improving the heat distribution within the module 100. For example, the heat spreader plate 124 may be a copper plate. The heat spreader plate 124 provides dual sided cooling by transferring the heat from the circuit board 120 to the primary cover 102. The primary cover 102 dissipates the heat using the air-flow-by cooling technique. Accordingly, the heat spreader plate 124 may function as a heat sink that cools the module 100 by dissipating the heat in the surrounding environment. The heat spreader plate 124 may enable controlling the pressure drop within the module 100 and the cooling amount on the circuit board 120.

Module 100 may further include a gasket seal 126 sandwiched between the primary cover 102 and the secondary cover 104 to provide a sealed casing. Gasket seal 126 is discussed below in greater detail in connection with FIG. 3.

The sealed casing of module 100 may form a Faraday cage that blocks external static and non-static electric fields by channeling electricity through the casing, providing constant voltage on all sides of the sealed casing. Since the difference in voltage is the measure of electrical potential, no current flows through the sealed casing. For example, the Faraday cage property of the sealed casing may protect the circuit board provided therein from electrostatic discharges. The sealed casing of module 100 is a continuous (i.e. unbroken) shell that prevents the entry or escape of an electromagnetic field. Accordingly, the sealed casing may protect the circuit board 120 from electromagnetic interference (EMI) emitted from a source external to the module 100. Thus, due to the sealed casing, the module 100 exhibits improved electromagnetic compatibility (EMC).

Figure 3:
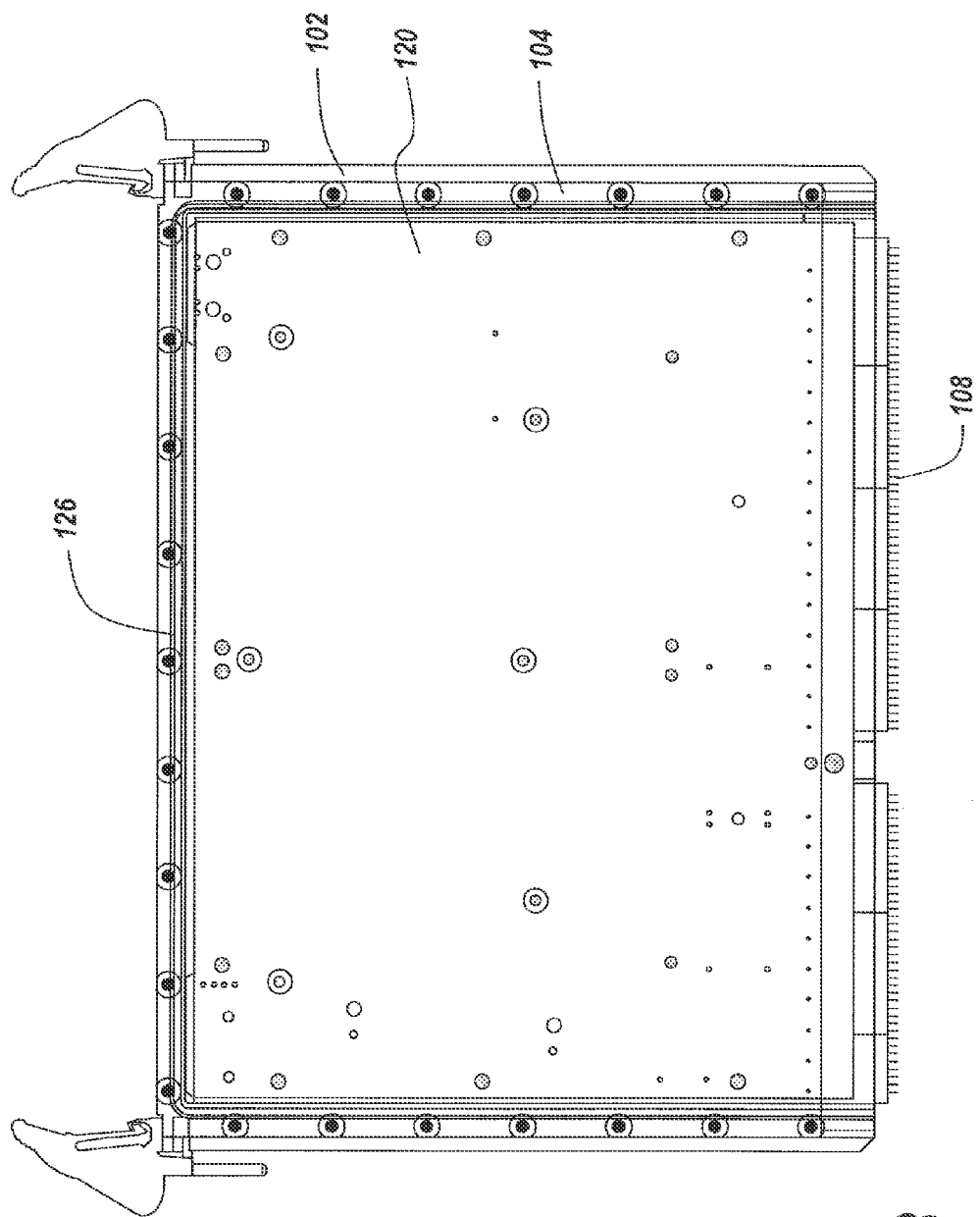
FIG. 3 illustrates a back view of the exemplary module shown in FIG. 1.

FIG. 3 illustrates back view of the module 100. As illustrated in FIG. 3, the gasket seal 126 is provided around the perimeter of the circuit board 120 excluding the side where the connectors 108 are provided. The gasket seal 126 may have an outside diameter of about 1 millimeter. The gasket seal 126 prevents external environmental contaminants such as particles in the atmosphere surrounding the module 100 from penetrating inside the module 100. The gasket seal 126 also protects the module 100 from electromagnetic interference by reducing the electromagnetic field generated by the circuit board 120. Exemplary materials for the gasket seal 126 may include flexible conductive gaskets from manufacturers such as Chromerics.

Figure 4:
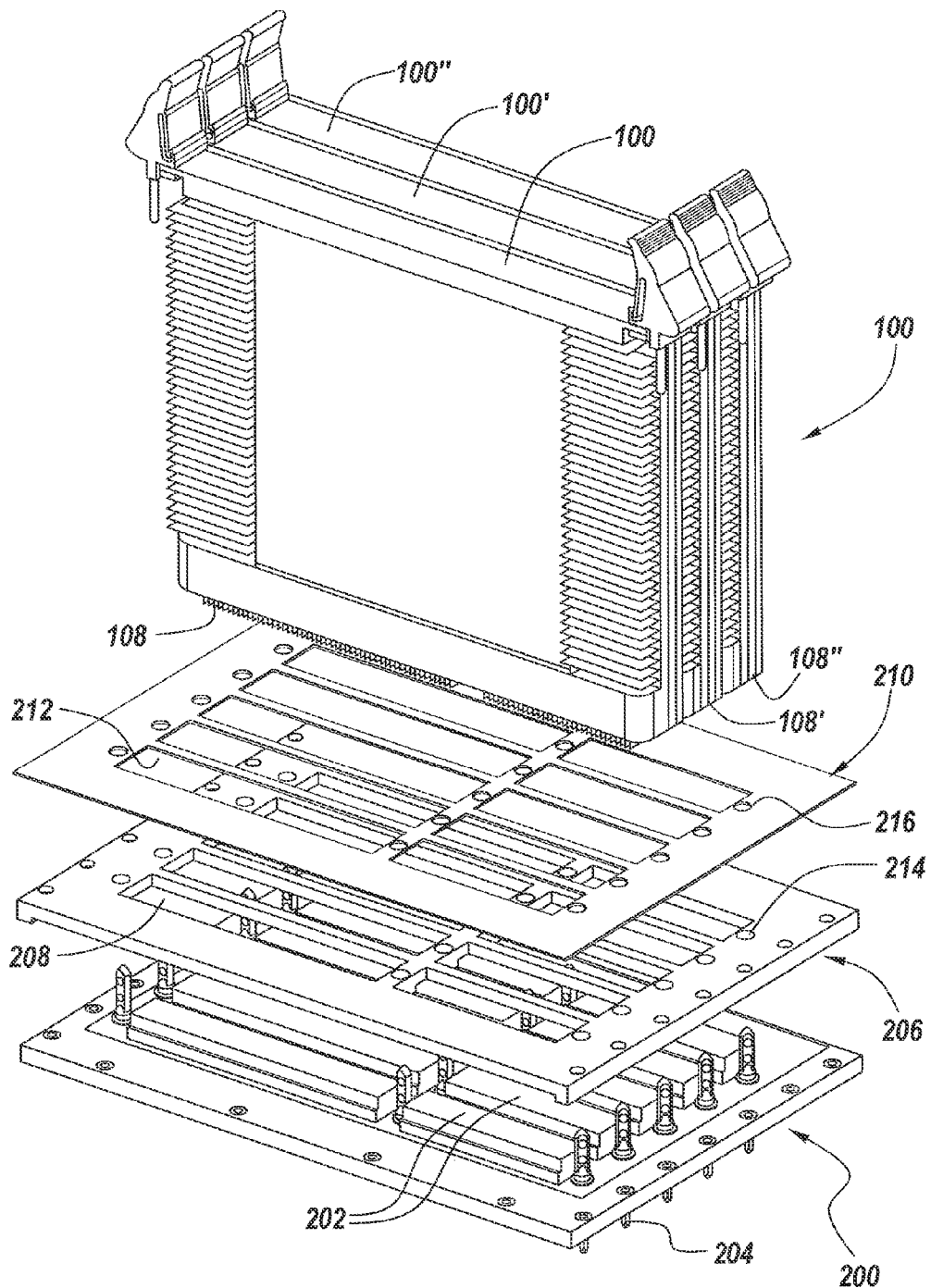
FIG. 4 illustrates a plurality of modules mounted on a backplane according to various embodiments of the present invention.

According to various embodiments, a plurality of modules 100, 100' and 100" may be coupled to a backplane 200 as illustrated in FIG. 4. The backplane 200 may include a plurality of connectors 202 that mate with the connectors 108, 108' and 108" of the modules 100, 100' and 100", respectively. Circuit board 120 of one module 100 may have a different functionality than a circuit board 120' of another module 100'. A backplane cover plate 206 may be provided on top of the surface of the backplane 200 facing the modules 100, 100' and 100". The backplane cover plate 206 provides a perimeter seal to limit external contaminants from reaching inside the backplane 200. A backplane gasket 210 may be provided on top of the backplane cover plate 206 so as to seal the connectors 108 of the modules 100, 100', 100" coupled to the connectors 202 of the backplane 200. The backplane 200, the backplane cover plate 206 and the backplane gasket 210 may be coupled together using one or more coupling devices 204. The coupling devices 204 may be provided on the surface of the backplane 200 facing the backplane cover plate 206. The coupling devices 204 may be configured to fit through holes 214 and 216 provided on the backplane cover plate 206 and the backplane gasket 210, respectively.

Figure 5:
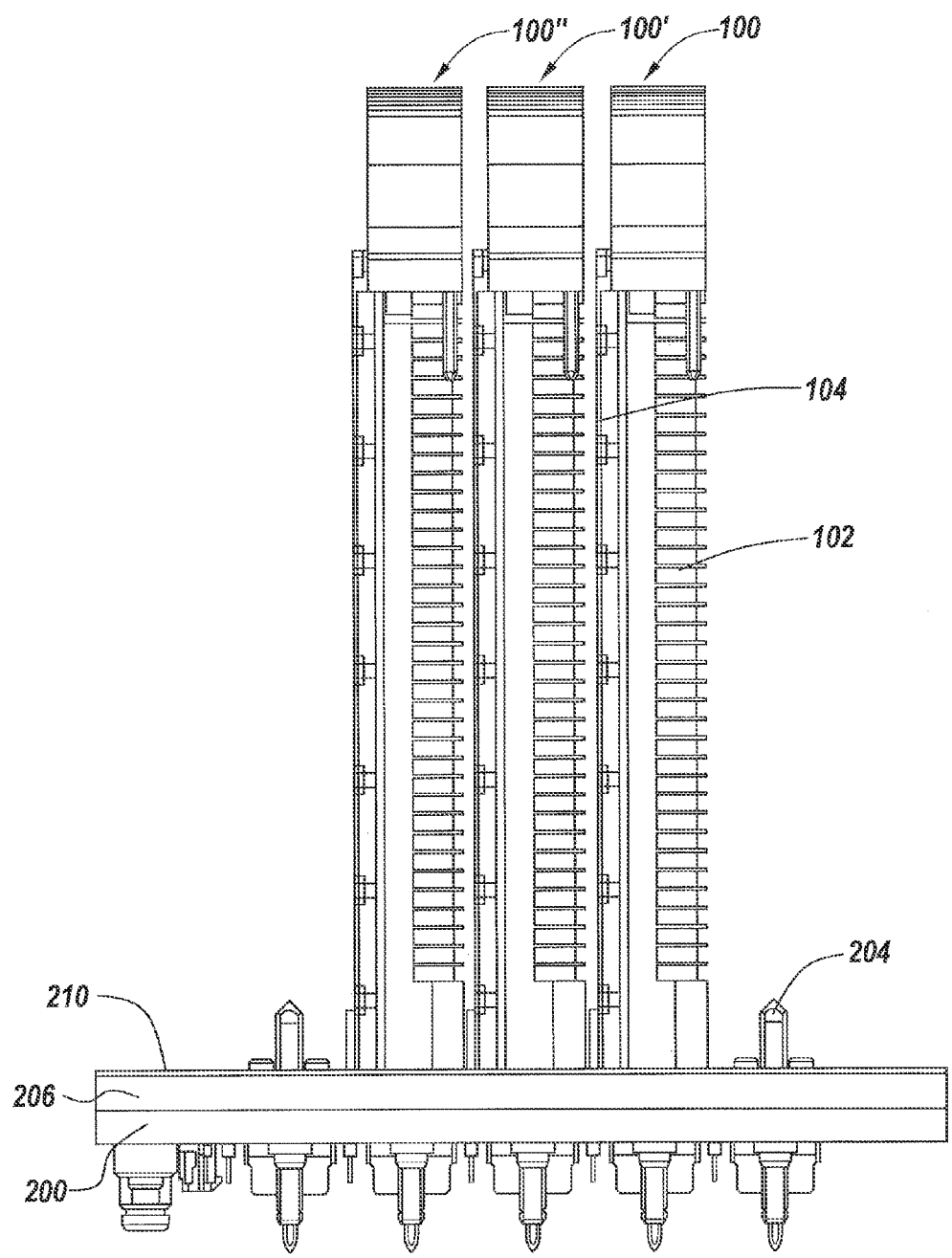
FIG. 5 illustrates a side view of the plurality of modules shown in FIG. 1, where the modules include fins on the primary cover according to various embodiments of the present invention.

According to an exemplary embodiment illustrated in FIG. 5, the secondary cover 104 of the module 100 may have a flat surface free from fins or channels. FIG. 5 illustrates a side view of an assembly formed by mounting three modules 100, 100' and 100" on backplane 200. The backplane 200, the backplane cover plate 206 and the backplane gasket 210 are coupled together using one or more coupling devices 204.

Figure 6:
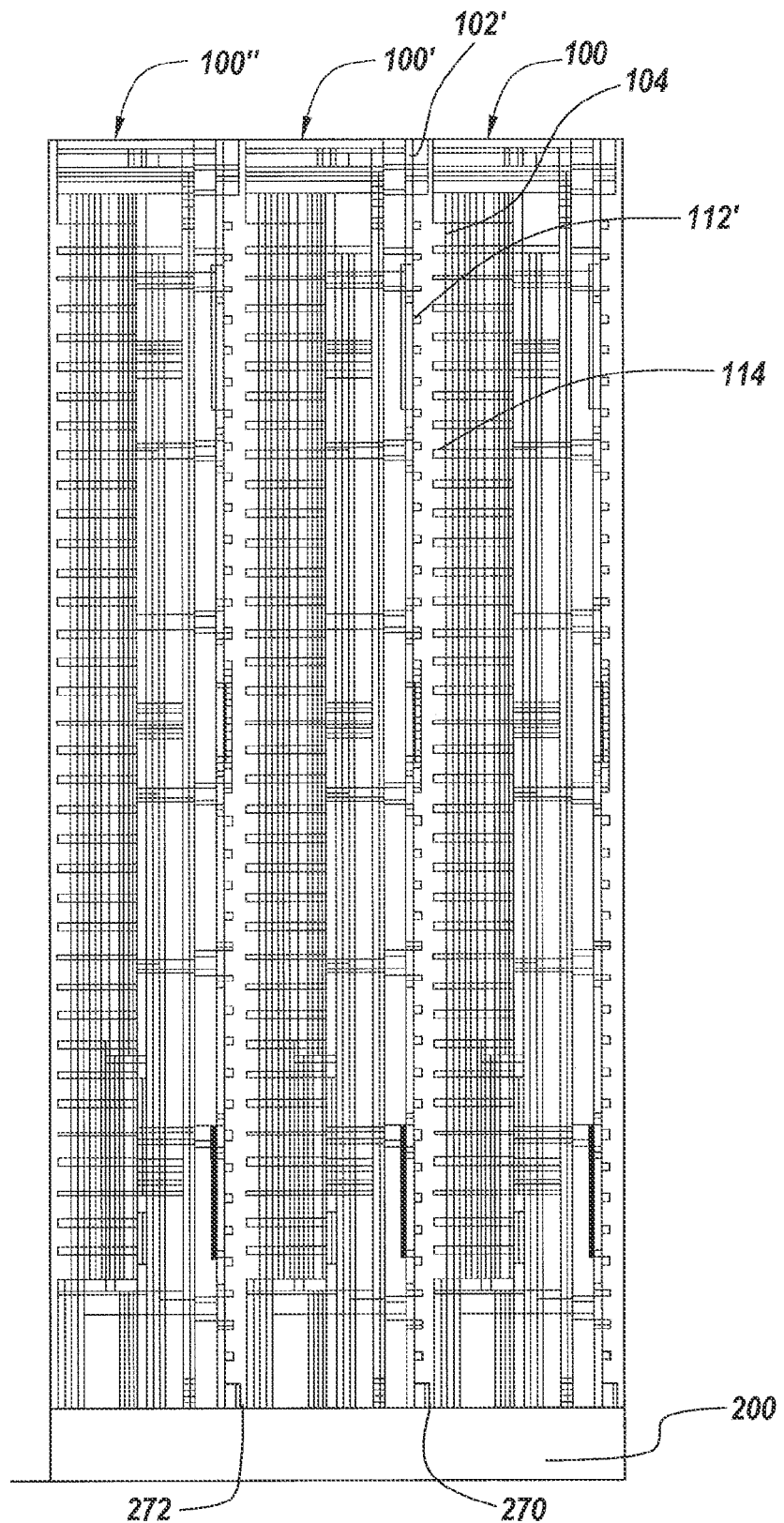
FIG. 6 illustrates a side view of the plurality of modules including fins on the primary cover and the secondary cover according to various embodiments of the present invention.

Alternatively, fins 114 may be provided on the secondary cover 104 of each of the modules 100, 100', and 100", as illustrated in FIG. 6 which allows for improved efficiency in double sided cooling.

When a plurality of modules is provided adjacent to each other, an air gap may be provided between the primary cover of one module and the secondary cover of an adjacent module. The air gap may be about 0.010 inch to about 0.050 inch wide. A vortex of air may be created between the adjacent modules due to the geometry of the fins provided on the primary cover of one module and the fins provided on the secondary cover of the adjacent module. For example, in FIG. 6, the fins 114 of the secondary cover 104 of module 100 are provided opposite from the fins 112' of the primary cover 102' of module 100'. An air gap 270 of about 0.010 inch to about 0.050 inch wide is formed between fins 112' and fins 114. As illustrated in FIG. 6, the first air gap 270 is formed between module 100 and adjacent module 100'. A second air gap 272 is formed between module 100' and adjacent module 100". The air gap 270 allows the cooling air to flow by the surface of the secondary cover 104 of module 100 and by the surface of primary cover 102' of module 100' cooling the modules 100 and 100' at the same time.

Figure 7A:
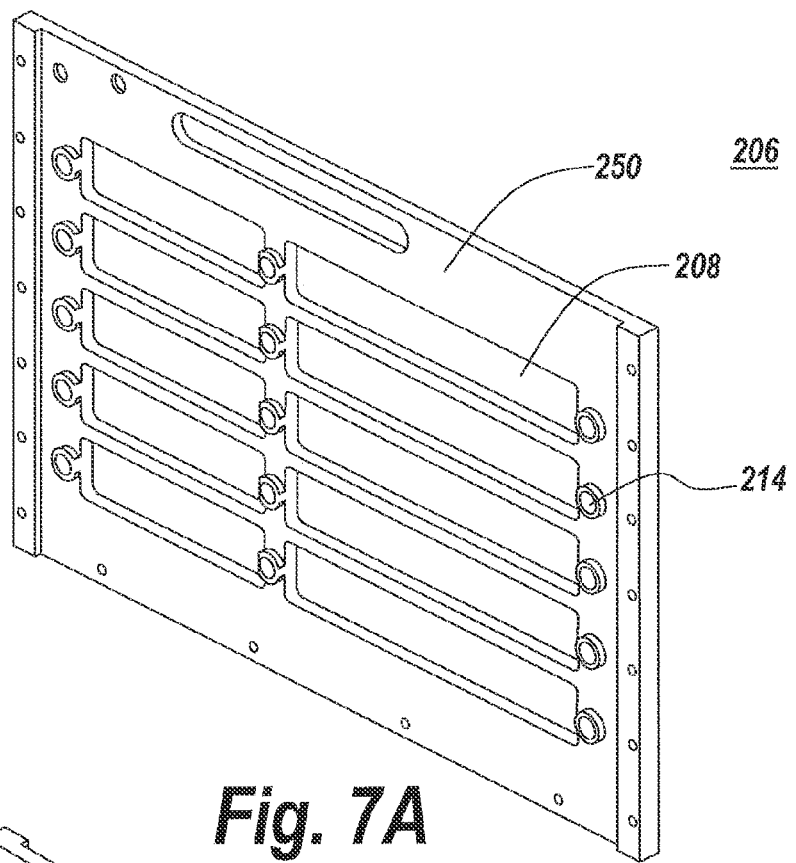
FIGS. 7A-7B illustrate an exemplary backplane cover plate according to various embodiments of the present invention.
Figure 7B:
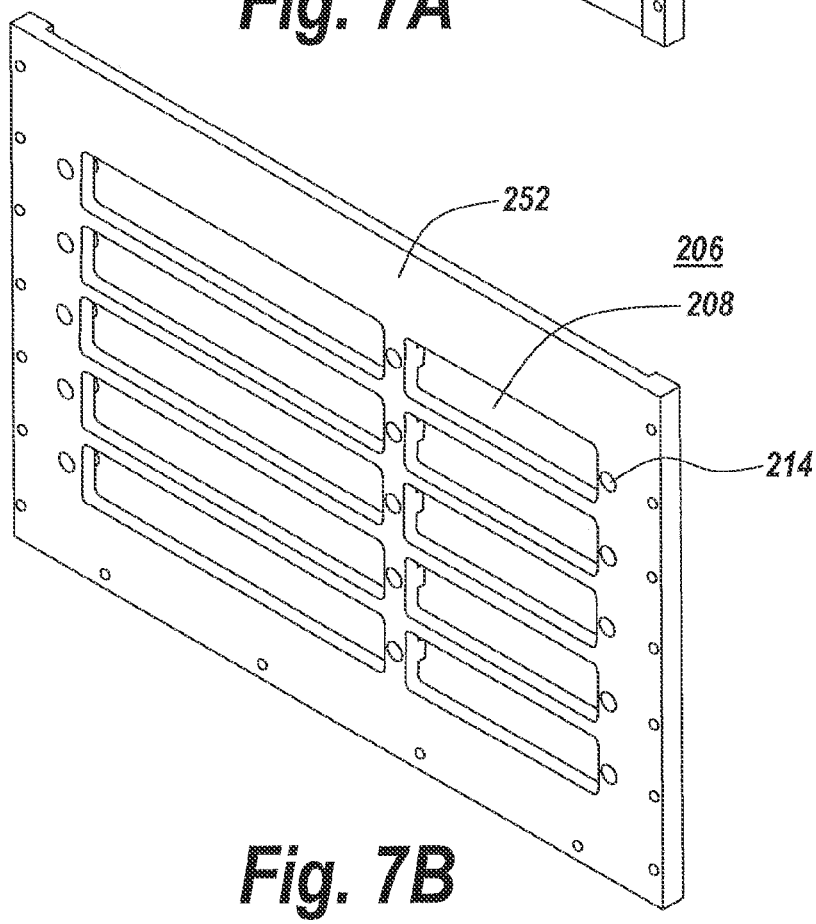

As discussed above in connection with FIG. 4, according to various embodiments of the present invention, a backplane cover plate may be provided between the modules and receiving surface of the backplane that receives the modules. The backplane cover serves as a stiffener or a sealing plate that provides a perimeter seal that limits contaminants from reaching inside of the backplane. An exemplary backplane cover plate 206 is illustrated in FIGS. 7A and 7B. The backplane cover plate 206 has a first surface 250 (illustrated in FIG. 7A) and a second surface 252 (illustrated in FIG. 7B) opposite from the first surface 250. The first surface 250 is in direct physical contact with the backplane. The backplane cover plate 260 may include a plurality of holes for receiving the coupling devices of the backplane. When the coupling devices of the backplane are coupled to the holes of the backplane cover plate 260, the backplane cover plate 260 forms a perimeter seal around the perimeter of the backplane. The backplane cover plate 260 may further include a plurality of openings (i.e., slots) 208 for receiving the connectors of the backplane therein. When the connectors of the backplane are coupled to the connectors of the modules mounted on the backplane, the backplane cover plate 260 forms a perimeter seal around the backplane connectors and the module connectors. The backplane cover plate 260 may be formed of aluminum, or lightweight high performance plastics such as Kevlar or a combination of both. According to various embodiments, the backplane cover plate 260 may be hard anodized to increase the resistance of the backplane cover plate 260 to corrosion and wear. An exemplary backplane cover plate 260 may weigh about 0.82 lbs.

Figure 8:
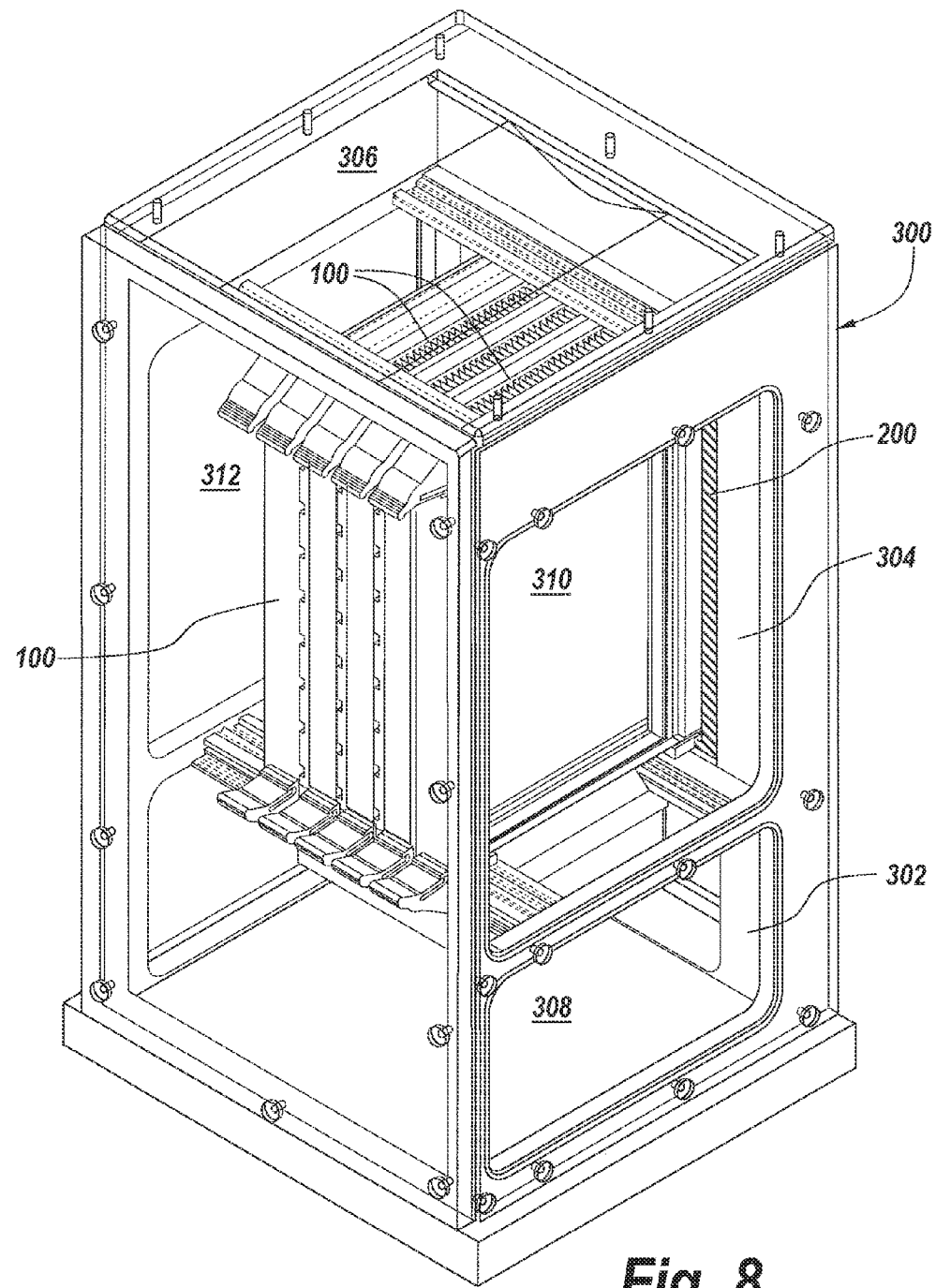
FIG. 8 illustrates an exemplary casing including the backplane and the modules mounted thereon according to various embodiments of the present invention.

As discussed above, according to various embodiments of the present application, a plurality of modules 100 may be mounted on a backplane, such as backplane 200 illustrated in FIGS. 4 and 5. The system including the backplane and the modules mounted thereon may also be provided in a casing, as illustrated in FIG. 8. According to various embodiments, the casing 300 may be transparent. The casing may include a plurality of compartments 302, 304 for better circulation of the cooling air used for air-flow-by cooling of the modules 100. The casing may have a plurality of panels, i.e. doors, 306, 308, 310 and 312 that provide access to different sections of the compartments 302, 304 of the casing 300. The panels 306, 308, 310 and 312 provide easy access to the modules 100 allowing for replacement and maintenance of the modules 100.

Figure 9:
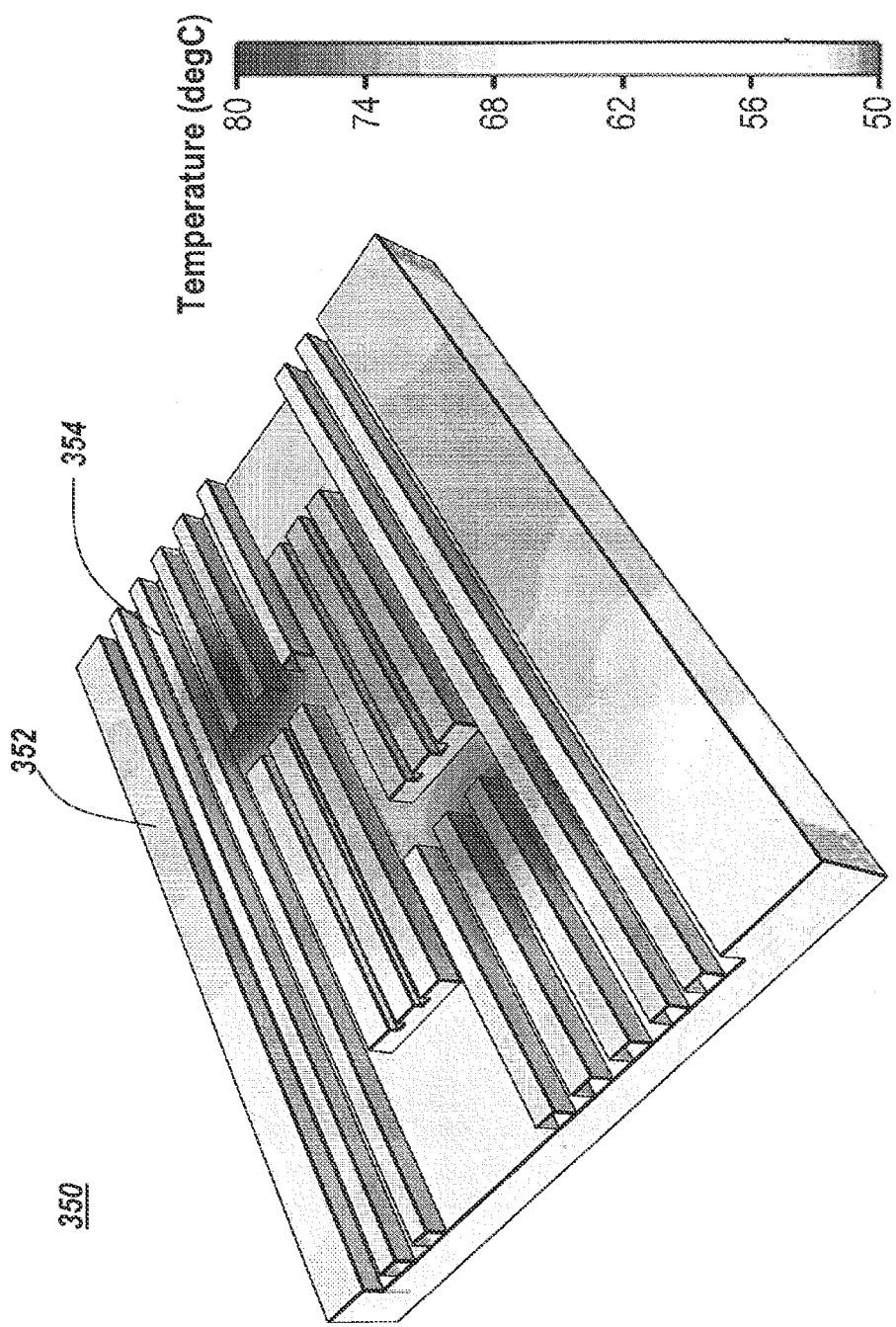
FIG. 9 illustrates a thermal image of an exemplary module including a plurality of asymmetrical channels on the primary cover according to various embodiments of the present invention.

As discussed above, an exemplary primary cover of the present invention may include a plurality of fins or channels for guiding cooling air on the surface of the primary cover. FIG. 9 illustrates the cooling effects of the air on exemplary module 350 that includes a primary cover 352 with a plurality of channels 354 formed according to a predetermined pattern. As illustrated in FIG. 9, the channels 354 may have different lengths and extend parallel to each other, along a long side of the primary cover 352.

FIG. 9 illustrates a thermal image of the exemplary module 350. The module 350 heats up when the components on the circuit board are running. The heated module 350 is cooled using the air-flow-by technique where the cooling air flows along the surface of the primary cover 352, guided by the channels 354. While some portions of the module 350 are cooled down to about 55° C., other portions are still at about 80° C. As illustrated in FIG. 9, the module 350 may not be uniformly cooled using the illustrated channels 354 on the primary cover 352.

Figure 10:
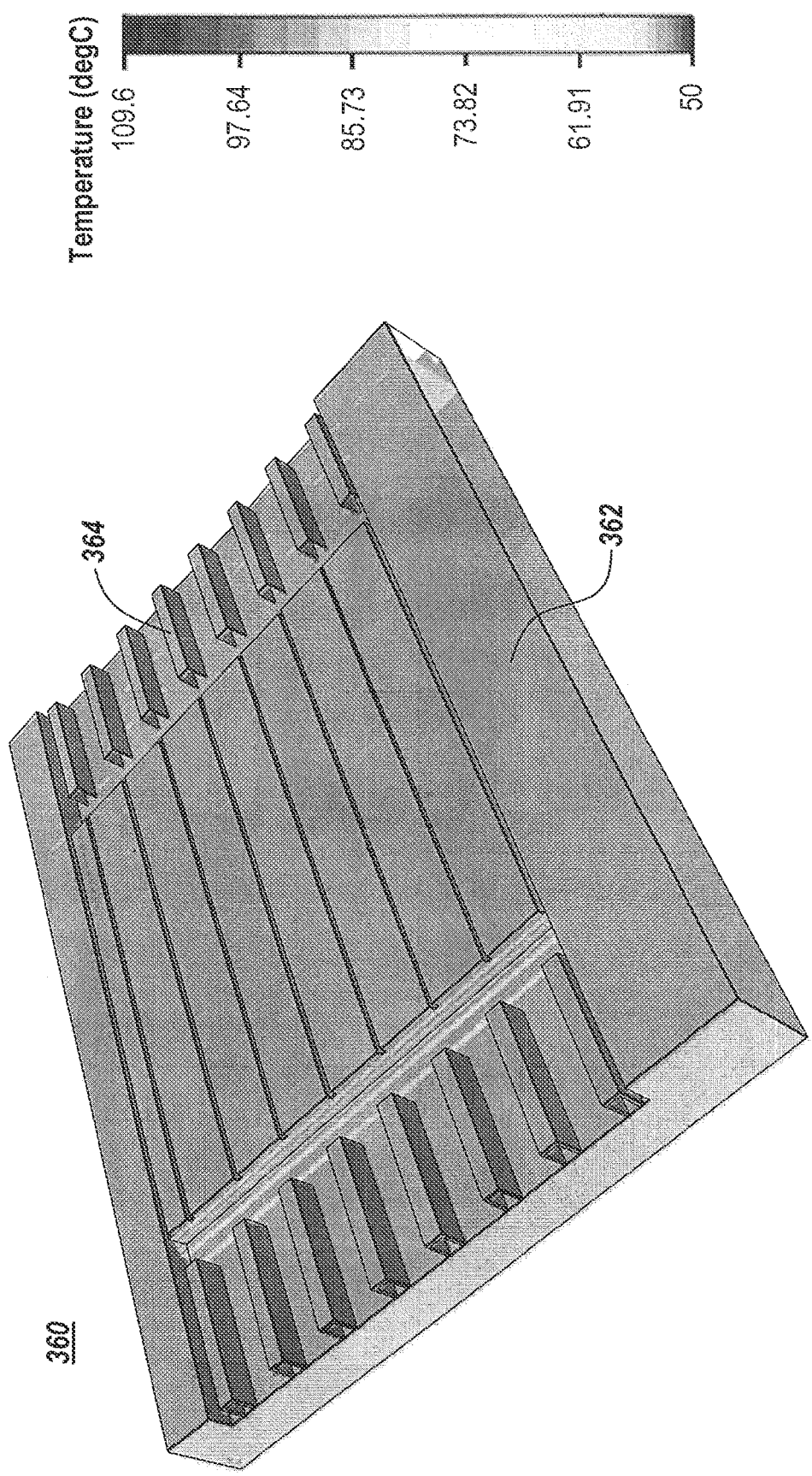
FIG. 10 illustrates a thermal image of an exemplary module including a plurality of symmetrical channels on the primary cover according to various embodiments of the present invention.

According to various embodiments, the channels 354 may be symmetrical with respect to an axis of symmetry. FIG. 10 illustrates a thermal image of exemplary module 360 that includes a primary cover 362 with a plurality of channels 364 formed according to a symmetrical pattern. As illustrated in FIG. 10, the channels 364 are formed along the edges of the surface of the primary cover 362. The channels 364 have identical dimensions and extend parallel to each other, and parallel to a long side of the primary cover 362.

FIG. 10 illustrates a thermal image of exemplary module 360. The module 360 heats up when the components on the circuit board are running. The heated module 360 is cooled using the air-flow-by technique where the cooling air flows along the surface of the primary cover 362, guided by the channels 364. As illustrated in FIG. 10, the module 360 is substantially uniformly cooled to about 60° C. using the channels 364 on the primary cover 362. The illustrated cooling technique allows for an improved mass transfer of thermal energy and lower component operating temperatures.

In some embodiments, the integrated primary covers of the modules may include a plurality of fins, instead of channels. The fins may extend along an entire surface of the primary cover, as illustrated in FIG. 2. Alternatively, the fins may extend along the edges of the primary cover, as illustrated in FIG. 1. The channels may be generally hollow structures while the fins may be enclosed filled structures. The fins may be solid or have a combination of fluids therein to assist in the transfer of thermal energy. Depending on the external atmosphere conditions, the fins may provide better cooling on the module covers than the channels, or vice versa.

Figure 11:
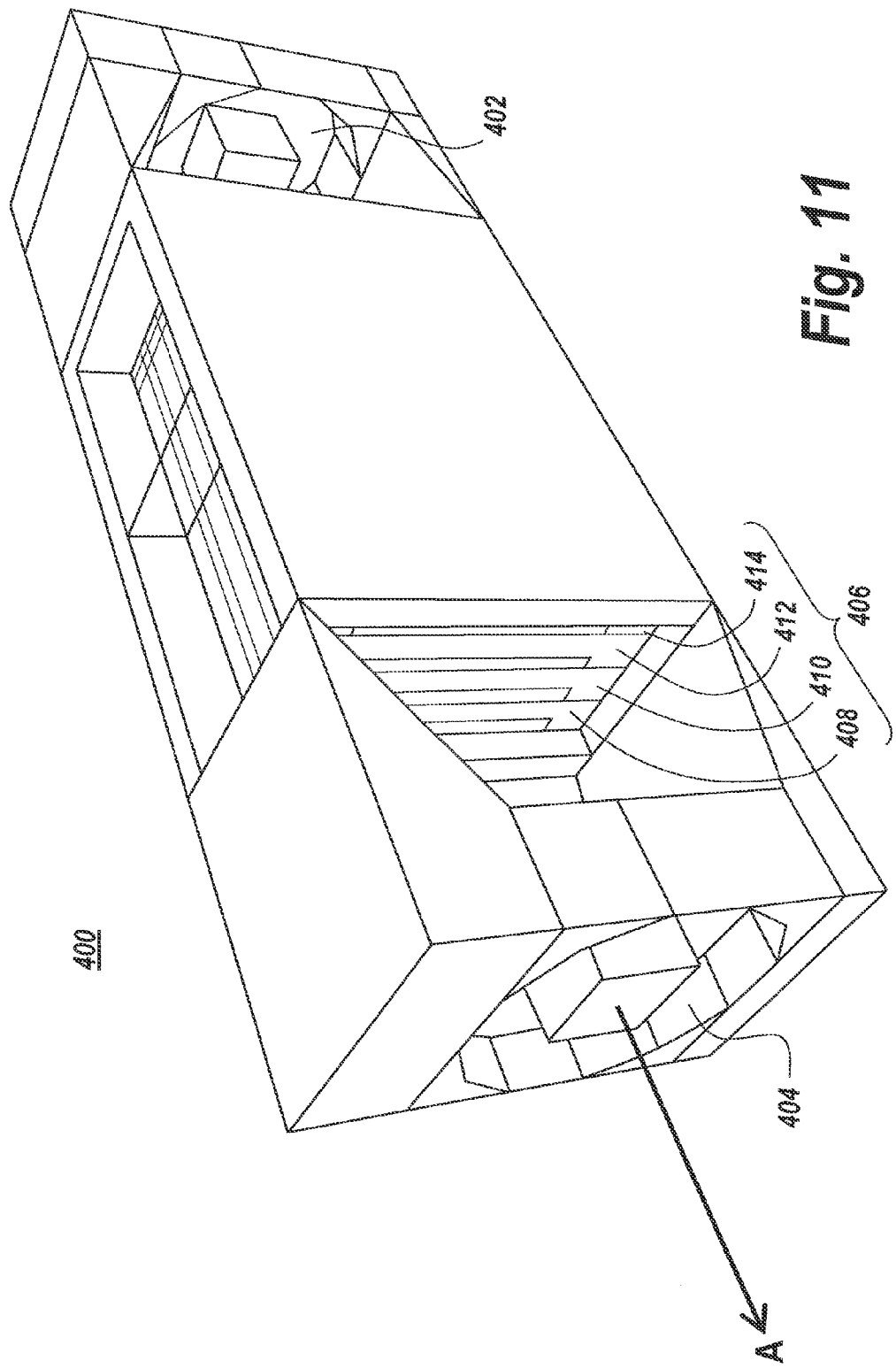
FIG. 11 illustrates an exemplary test environment where a module stack including a plurality of modules is provided within a wind tunnel according to various embodiments of the present invention.

FIGS. 11-14 illustrate the effects of varying the dimensions and spacing of the channels on the primary covers of the modules. FIG. 11 illustrates an exemplary test environment where a module stack 406 including a plurality of modules 408, 410, 412 and 414 is provided within a wind tunnel 400. Fans 402, 404 are provided at each end of the wind tunnel 400 for creating an air flow in the direction of the arrow A. The wind tunnel 400 provides a controlled methodology to push the air through the covers of the modules 408, 410, 412 and 414. The air flows by the channels provided on the module covers cooling the modules 408, 410, 412 and 414.

Figure 12:
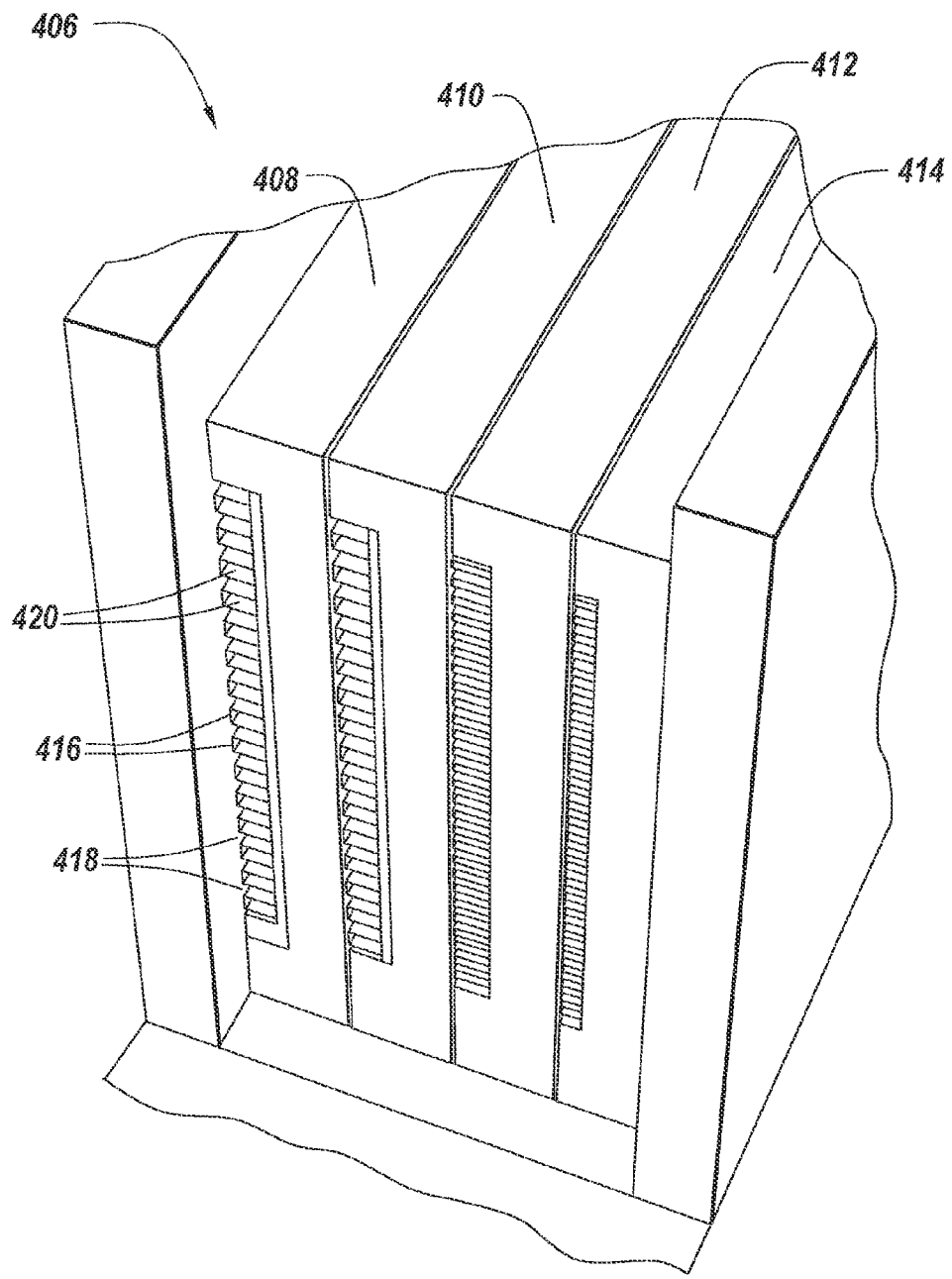
FIG. 12 illustrates a detailed view of the plurality of modules of the module stack shown in FIG. 11.
Figure 13:
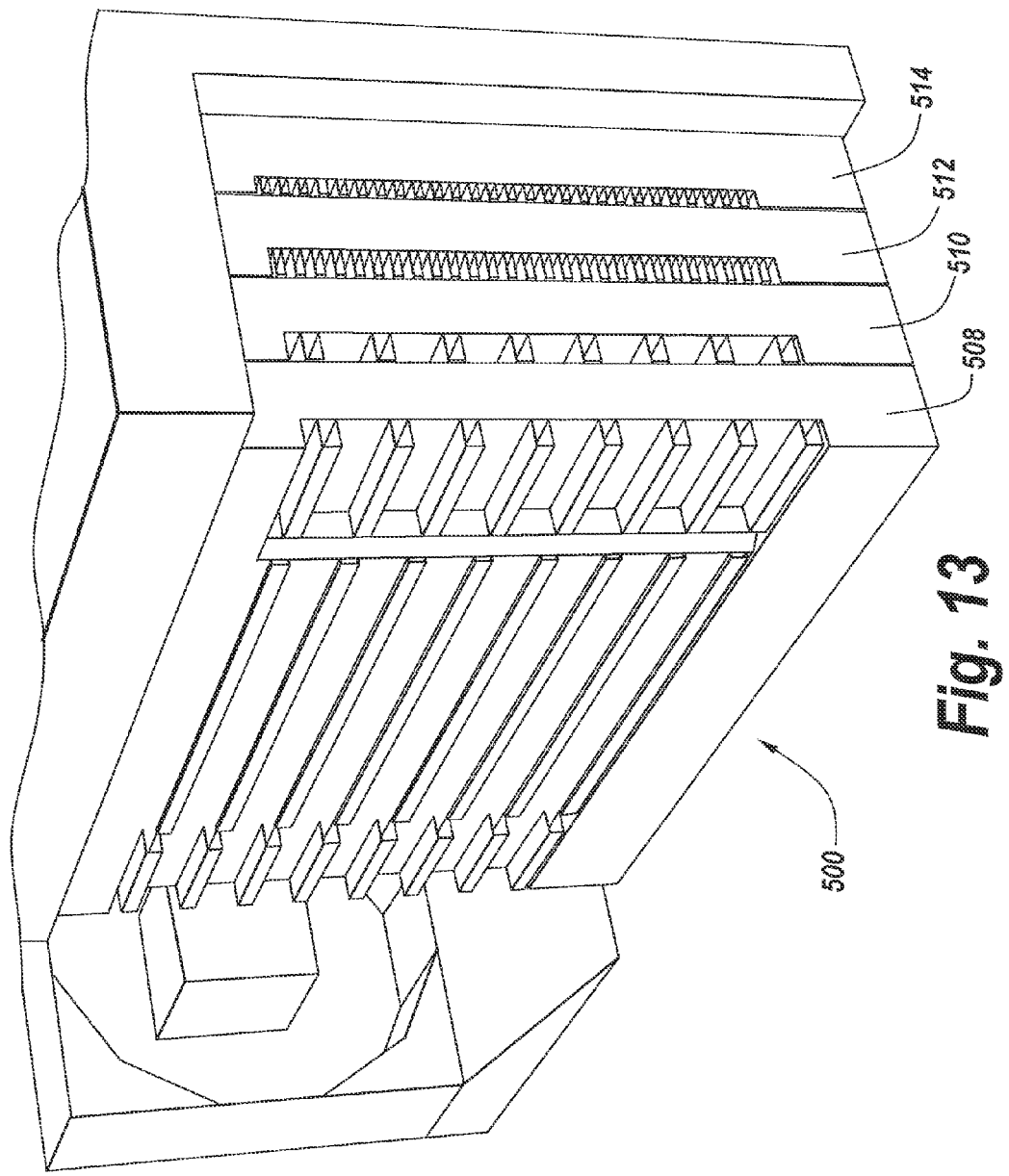
FIG. 13 illustrates modified fin geometries in connection with the modules of the module stack shown in FIG. 11 according to various embodiments of the present invention.

In the exemplary embodiment illustrated in FIG. 12, modules 408 and 410 may include, for example, a mobile Intel® processor such as the Jasper Forest or Dual Romley processor. Module 412 may include an Intel® Jasper Forest processor. Module 414 may include a general processor unit (GPU). One or more of the modules 408, 410, 412 and 414 may have a plurality of channels 416 on the primary cover. The modules 408, 410, 412 and 414 illustrated in FIG. 12 do not have channels or fins on the secondary covers. However, according to various embodiments, fins or channels may be provided on the secondary covers in addition to, or instead of, the channels on the primary covers.

The spacing between the channels and the opening of the channels may be different from one module to another. For example, in the exemplary system illustrated in FIG. 12, the spacing 418 between the channels 416 of the Arrandale modules 408 and 410 is larger than the spacing between the channels of the Jasper Forest module 412 and the GPU module 414. In addition, the opening 420 of the channels 416 of the Arrandale modules 408 and 410 is larger than the opening of the channels of the Jasper Forest module 412 and the GPU module 414. Moreover, the height 422 of the channels 416 of the Jasper Forest module 412 is larger than the height of the channels of the GPU module 414.

Different channel/fin geometries can be used for the modules of a module stack. For example, in the module stack 500 illustrated in FIG. 13, the Arrandale modules 508 and 510 may have a reduced number of channels compared to the Arrandale modules 408 and 410 illustrated in FIG. 12. The Jasper Forest module 512 and the GPU module 514 of the module stack 500 may be similar to the Japer Forest module 412 and the GPU module 414 of the module stack illustrated in FIG. 12.

Figure 14:
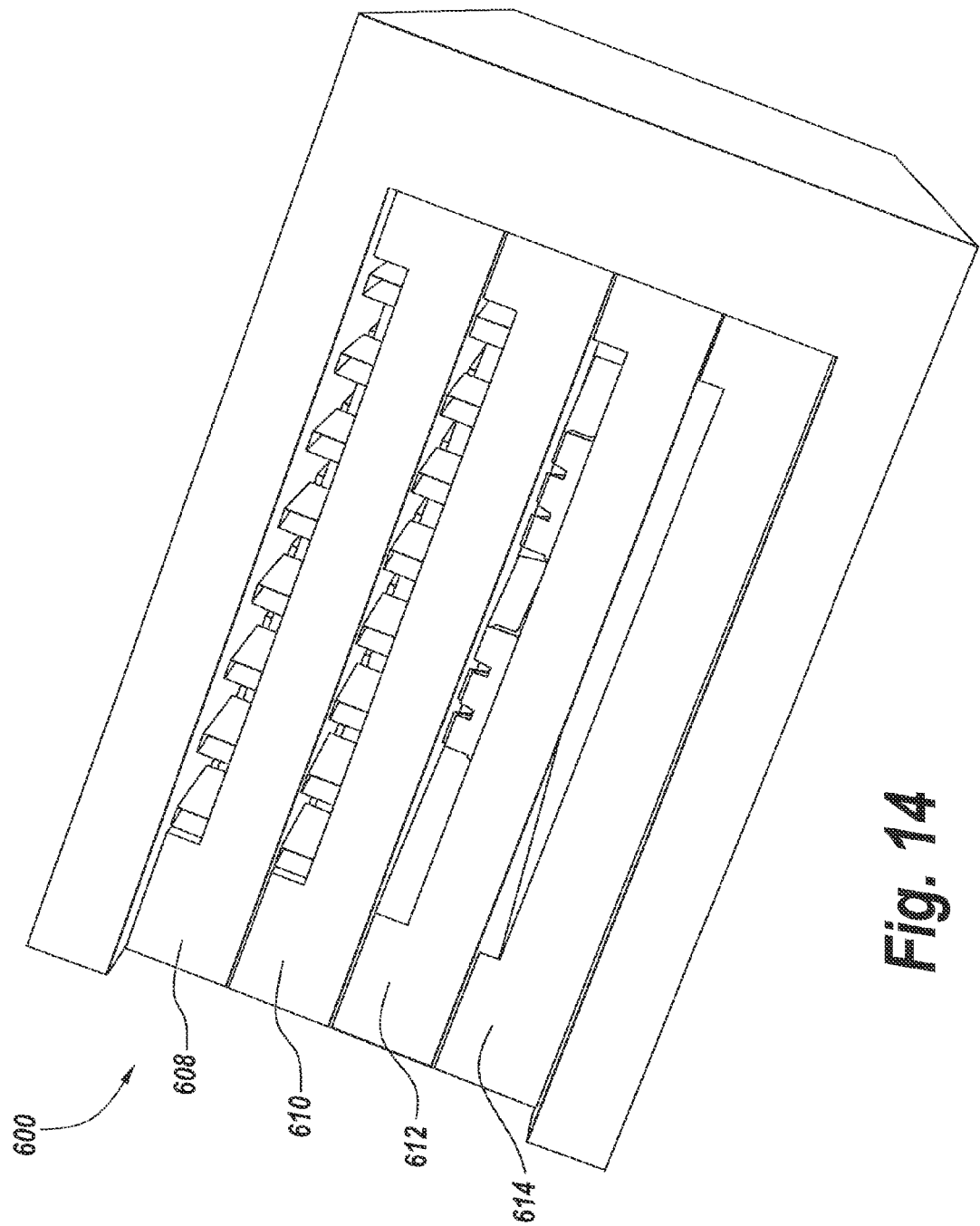
FIG. 14 illustrates modified fin geometries in connection with the modules of the module stack shown in FIG. 11 according to various embodiments of the present invention.

In the exemplary module stack 600 illustrated in FIG. 14, the Arrandale modules 608 and 610 have a reduced number of channels compared to the Arrandale modules 408 and 410 illustrated in FIG. 12. The Japer Forest module 612 and the GPU module 614 of the module stack 600 have no channels.

The foregoing description of embodiments and examples is intended to provide illustration and description, but is not intended to be exhaustive. Modifications and variations are possible in light of the above teachings or may be acquired from a practice of the invention. It is intended that the invention will include any and all particular embodiments and equivalents falling within the scope of the following appended claims.

The invention claimed is:

1. A system comprising:
a plurality of circuit board modules, wherein each circuit board module includes:
a primary cover including a plurality of fins or channels for guiding cooling air flowing on a surface of the primary cover;
a secondary cover including a plurality of fins or channels for guiding cooling air flowing on a surface of the secondary cover;
a circuit board sandwiched between the primary cover and the secondary cover,
a gasket seal provided along a perimeter of the primary cover so that the primary cover, the secondary cover and the gasket seal form a continuous unbroken shell that acts as a faraday cage, wherein the gasket is configured to prevent external environmental contaminants from penetrating inside the module and is configured to protect the module from electromagnetic interference by reducing an electromagnetic field generated by the circuit board;
a backplane, wherein the plurality of circuit board modules are coupled to the backplane the plurality of circuit board modules including a first circuit board module and a second circuit board module, the primary cover of the first circuit board module facing the secondary cover of the second circuit board module when coupled to the backplane so that the fins or channels of the primary cover of the first circuit board module are out of alignment along a longitudinal axis that extends through a length of the first circuit board module with the fins or channels of the secondary cover of the second circuit board module and there being an air gap between the fins or channels of the primary cover of the first circuit board module and the fins or channels of the secondary cover of the second circuit board module so that a vortex of air is created between the first circuit board module and the second circuit board module when cooling air passes between the first circuit board module and the second circuit board module; and
wherein the geometry and/or spacing of the fins or the channels is non-uniform so that an amount of cooling air flowing over a first of the fins substantially differs from an amount of cooling air flowing over a second of the fins or an amount of cooling air flowing over a first of the channels substantially differs from an amount of cooling air that flows over a second of the channels; the geometry being created by the covers of the circuit board modules having a controlled spacing form each other and do not touch each other, the vortex of air being controlled by the rising and lowering of the geometry to impact air flow and air speed;
a backplane cover plate coupled to the backplane, wherein the backplane cover plate is provided between the backplane and the plurality of modules coupled to the backplane and serves as a seal to limit external contaminants from reaching inside the backplane.

2. The system of claim 1, further comprising:
a backplane gasket coupled to the backplane cover plate, wherein the backplane gasket is provided between the backplane cover plate and the one or more modules coupled to the backplane.

3. The system of claim 1, wherein each circuit board module further includes:
one or more ejectors for decoupling the circuit board module from the backplane.

4. The system of claim 1, wherein the air gap is less than 0.05 inch wide.

* * * * *